(12) United States Patent
Honda et al.

(10) Patent No.: US 8,104,428 B2
(45) Date of Patent: Jan. 31, 2012

(54) PLASMA PROCESSING APPARATUS

(75) Inventors: Masanobu Honda, Nirasaki (JP);
Noriaki Kodama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 685 days.

(21) Appl. No.: 11/689,119

(22) Filed: Mar. 21, 2007

(65) Prior Publication Data

US 2007/0234960 A1    Oct. 11, 2007

Related U.S. Application Data

(60) Provisional application No. 60/789,145, filed on Apr. 5, 2006.

(30) Foreign Application Priority Data

Mar. 23, 2006    (JP) .................... 2006-081352

(51) Int. Cl.
   *C23C 16/00*    (2006.01)
   *C23C 16/50*    (2006.01)
   *C23F 1/00*    (2006.01)
   *H01L 21/306*    (2006.01)

(52) U.S. Cl. ............ 118/723 R; 118/715; 118/723 E; 118/728; 156/345.43; 156/345.44; 156/345.47; 156/345.51

(58) Field of Classification Search .......... 118/722, 118/723 E, 723 R; 156/345.43, 345.44, 345.45, 156/345.46, 345.47
See application file for complete search history.

(56) References Cited

U.S. PATENT DOCUMENTS

| | | | |
|---|---|---|---|
| 6,074,518 A | 6/2000 | Imafuku et al. | |
| 6,733,620 B1 * | 5/2004 | Sugiyama et al. | 156/345.29 |
| 6,872,281 B1 * | 3/2005 | Chen et al. | 156/345.43 |
| 2003/0205327 A1 * | 11/2003 | Howald et al. | 156/345.28 |
| 2005/0039773 A1 * | 2/2005 | Moriya et al. | 134/1.2 |
| 2005/0103440 A1 * | 5/2005 | Sato et al. | 156/345.29 |
| 2006/0037701 A1 * | 2/2006 | Koshiishi et al. | 156/345.44 |

FOREIGN PATENT DOCUMENTS

| | | |
|---|---|---|
| JP | 56-087672 | 7/1981 |
| JP | 62-40728 | 2/1987 |
| JP | 8-264515 | 10/1996 |
| JP | 08-319588 | 12/1996 |
| JP | 2002-057110 | 2/2002 |
| JP | 2002-151471 | 5/2002 |
| WO | WO2005/124844 | 12/2005 |

OTHER PUBLICATIONS

Office Action issued in Japanese Patent Application No. 2006-081352, mailed Sep. 13, 2011 (with English translation).

* cited by examiner

*Primary Examiner* — Maureen Gramaglia
*Assistant Examiner* — Tiffany Nuckols
(74) *Attorney, Agent, or Firm* — Oblon, Spivak, McClelland, Maier & Neustadt, L.L.P.

(57) ABSTRACT

A plasma processing apparatus that enables formation of a deposit film on a surface of a grounding electrode to be prevented. A substrate processing chamber has therein a processing space in which plasma processing is carried out on a substrate, an RF electrode that applies radio frequency electrical power into the processing space, a DC electrode that applies a DC voltage into the processing space, and a grounding electrode at least part of which is exposed in the substrate processing chamber. The grounding electrode is disposed in a corner portion formed through intersection of a plurality of internal surfaces in the substrate processing chamber.

2 Claims, 8 Drawing Sheets

PLASMA PROCESSING APPARATUS

BACKGROUND OF THE INVENTION

1. Field of the Invention

The present invention relates to a plasma processing apparatus, and in particular to a plasma processing apparatus having therein an electrode that is connected to a DC power source.

2. Description of the Related Art

Parallel plate type plasma processing apparatuses are known that have a substrate processing chamber that has therein a processing space and into which is transferred a wafer as a substrate, a lower electrode that is disposed in the substrate processing chamber and is connected to a radio frequency power source, and an upper electrode that is disposed such as face the lower electrode. In such a plasma processing apparatus, a processing gas is introduced into the processing space, and radio frequency electrical power is applied into the processing space between the upper electrode and the lower electrode. When a wafer has been transferred into the processing space and mounted on the lower electrode, the introduced processing gas is turned into plasma through the radio frequency electrical power so as to produce ions and so on, and the wafer is subjected to plasma processing, for example etching processing, by the ions and so on.

In recent years, with an aim of improving the plasma processing performance, plasma processing apparatuses in which the upper electrode is connected to a DC power source so that a DC voltage is applied into the processing space have been developed. To apply the DC voltage into the processing space, an electrode at ground potential (hereinafter referred to as the "grounding electrode") having a surface thereof exposed to the processing space must be provided. However, in the case of carrying out the plasma processing using a reactive processing gas, reaction product (deposit) may become attached to the surface of the grounding electrode so that a deposit film is formed thereon. Such a deposit film is insulating, and hence the DC current flow from the upper electrode to the grounding electrode is impeded, so that the DC voltage can no longer be applied into the processing space; as a result, the plasma in the processing space may fall into an unstable state, or the plasma properties may change. It is thus necessary to remove such a deposit film from the grounding electrode.

Conventionally, as a method of removing a deposit film from an electrode surface, there has been known a method in which oxygen ($O_2$) gas is introduced into the processing space, and oxygen ions and oxygen radicals are produced from the oxygen gas, so that the deposit film is removed through reaction with the oxygen ions and oxygen radicals (see, for example, Japanese Laid-open Patent Publication (Kokai) No. S62-040728).

However, for the above method of removing a deposit film, processing separate to the wafer plasma processing must be carried out, and hence there is a problem that the productivity of production of semiconductor devices from the wafers decreases. That is, there is a problem that removing the deposit film from the electrode surface is not practical from the viewpoint of productivity.

SUMMARY OF THE INVENTION

The present invention provides a plasma processing apparatus that enables formation of a deposit film on a surface of a grounding electrode to be prevented.

In a first aspect of the present invention, there is provided a plasma processing apparatus comprising a substrate processing chamber having therein a processing space in which plasma processing is carried out on a substrate, an RF electrode that applies radio frequency electrical power into the processing space, a DC electrode that applies a DC voltage into the processing space, and a grounding electrode at least part of which is exposed in the substrate processing chamber, wherein the grounding electrode is disposed in a corner portion formed through intersection of a plurality of internal surfaces in the substrate processing chamber.

According to the above construction, although a deposit film is formed by ions, because electrons of plasma produced in the processing space do not readily enter the corner portion of the substrate processing chamber, the number of ions is reduced in the corner portion. Such ions thus do not reach the grounding electrode, and hence a deposit film can be prevented from being formed on the surface of the grounding electrode.

A cross-sectional shape of a portion of the grounding electrode exposed in the substrate processing chamber in a cross section of the substrate processing chamber can be contained within a circle of radius 5 mm centered on a position where the internal surfaces intersect.

According to the above construction, ions of the plasma produced in the processing space do not enter the above circle. As a result, a deposit film can be reliably prevented from being formed on the surface of the grounding electrode.

In a second aspect of the present invention, there is provided a plasma processing apparatus comprising a substrate processing chamber having therein a processing space in which plasma processing is carried out on a substrate, an RF electrode that applies radio frequency electrical power into the processing space, a DC electrode that applies a DC voltage into the processing space, and a grounding electrode at least part of which is exposed in the substrate processing chamber, wherein the substrate processing chamber has therein a recess that is recessed with respect to the processing space; and the grounding electrode is housed in the recess.

According to the above construction, although a deposit film is formed by ions, because electrons of plasma produced in the processing space do not readily enter the corner portion (recess) of the substrate processing chamber, the number of ions is reduced in the corner portion (recess). Such ions thus do not reach the grounding electrode, and hence a deposit film can be prevented from being formed on the surface of the grounding electrode.

In a third aspect of the present invention, there is provided a plasma processing apparatus comprising a substrate processing chamber having therein a processing space in which plasma processing is carried out on a substrate, an RF electrode that applies radio frequency electrical power into the processing space, a DC electrode that applies a DC voltage into the processing space, and a grounding electrode at least part of which is exposed in the substrate processing chamber, wherein the grounding electrode is disposed at a place having a low electron density.

According to the above construction, the Coulomb field of ions acting on electrons is shielded at such a place having a low electron density. The electrons and ions thus do not attract one another, and hence the electrons and ions do not coexist, whereby plasma does not readily exist. Ions that would form a deposit film thus do not reach the grounding electrode, and hence a deposit film can be prevented from being formed on the surface of the grounding electrode.

A cross-sectional shape of a portion of the grounding electrode exposed in the substrate processing chamber in a cross section of the substrate processing chamber can be contained within a circle of radius 5 mm centered on a position where the electron density is not more than $10^7$ cm$^{-3}$.

According to the above construction, at such a position where the electron density is not more than $10^7$ cm$^{-3}$, the Coulomb field of an ion does not act on electrons more than 5 mm away, and hence ions and electrons do not coexist at this position, and thus plasma does not exist. A deposit film can thus be reliably prevented from being formed on the surface of the grounding electrode.

The above and other objects, features and advantages of the invention will become apparent from the following detailed description taken in conjunction with the accompanying drawings.

DESCRIPTION OF THE PREFERRED EMBODIMENT

The present invention will now be described in detail below with reference to the accompanying drawings showing an embodiment thereof.

Figure 1:
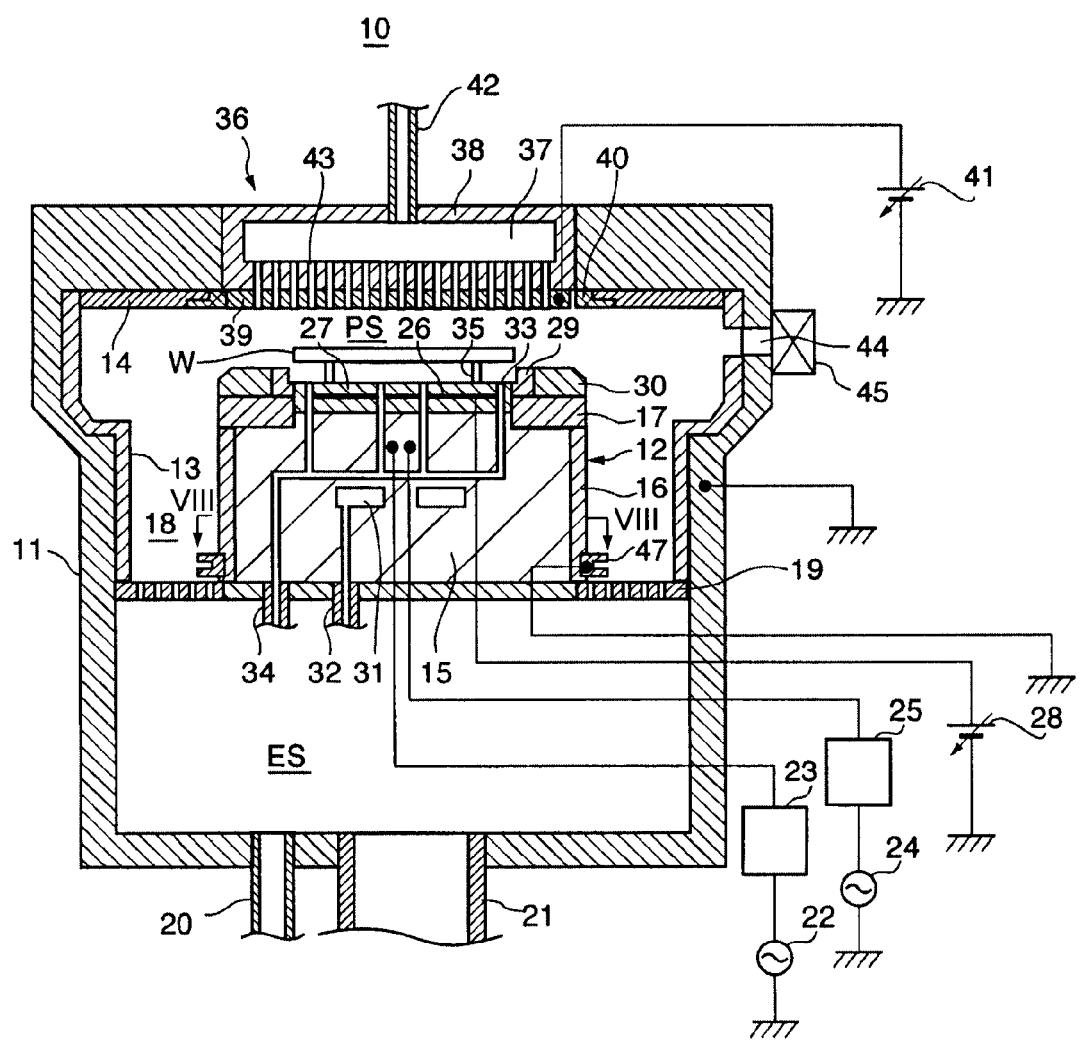
FIG. 1 is a sectional view schematically showing the construction of a plasma processing apparatus according to an embodiment of the present invention.

FIG. 1 is a sectional view schematically showing the construction of a plasma processing apparatus according to the present embodiment. The plasma processing apparatus is constructed such as to carry out RIE (reactive ion etching) processing on a semiconductor wafer W as a substrate.

As shown in FIG. 1, the plasma processing apparatus 10 has a substantially cylindrical substrate processing chamber 11, there being a processing space PS in an upper portion of the substrate processing chamber 11. Plasma, described below, is produced in the processing space PS. Moreover, the substrate processing chamber 11 has disposed therein a cylindrical susceptor 12 as a stage on which is mounted a semiconductor wafer W (hereinafter referred to merely as a "wafer W") having a diameter of, for example, 300 mm. An inner wall side surface of the substrate processing chamber 11 is covered by a side wall member 13, and an inner wall upper surface of the substrate processing chamber 11 is covered by an upper wall member 14. Each of the side wall member 13 and the upper wall member 14 is made of aluminum, a surface thereof that faces the processing space PS being coated with yttria or alumite having a predetermined thickness. The substrate processing chamber 11 is electrically grounded, and hence the side wall member 13 and the upper wall member 14 are at ground potential. The susceptor 12 has a conductor portion 15 made of a conductive material, for example aluminum, a susceptor side face covering member 16 made of an insulating material covering a side face of the conductor portion 15, and an enclosure member 17 made of quartz (Qz) mounted on the susceptor side face covering member 16.

In the plasma processing apparatus 10, an exhaust flow path 18 that acts as a flow path through which gas above the susceptor 12 is exhausted out of the substrate processing chamber 11 is formed between the inner wall of the substrate processing chamber 11 and the side face of the susceptor 12. An exhaust plate 19 which is a plate-shaped member having a large number of vent holes therein is disposed in the exhaust flow path 18. The exhaust plate 19 partitions the exhaust flow path 18 from an exhaust space ES which is a space in a lower portion of the substrate processing chamber 11. Here, the exhaust flow path 18 communicates the exhaust space ES and the processing space PS together. Moreover, a roughing exhaust pipe 20 and a main exhaust pipe 21 are provided opening out from the exhaust space ES. The roughing exhaust pipe 20 has a DP (dry pump) (not shown) connected thereto, and the main exhaust pipe 21 has a TMP (turbo-molecular pump) (not shown) connected thereto.

The roughing exhaust pipe 20, the main exhaust pipe 21, the DP, and the TMP together constitute an exhausting apparatus. The roughing exhaust pipe 20 and the main exhaust pipe 21 exhaust gas in the processing space PS out of the substrate processing chamber 11 via the exhaust flow path 18 and the exhaust space ES. Specifically, the roughing exhaust pipe 20 reduces the pressure in the substrate processing chamber 11 from atmospheric pressure down to a low vacuum state, and the main exhaust pipe 21 is operated in collaboration with the roughing exhaust pipe 20 to reduce the pressure in the substrate processing chamber 11 from atmospheric pressure down to a high vacuum state (e.g. a pressure of not more than 133 Pa (1 Torr)), which is at a lower pressure than the low vacuum state.

A radio frequency power source 22 is connected to the conductor portion 15 of the susceptor 12 via a matcher 23. The radio frequency power source 22 supplies radio frequency electrical power of a relatively high frequency, for example 40 MHz, to the conductor portion 15. The conductor portion 15 of the susceptor 12 thus acts as an RF electrode. The matcher 23 reduces reflection of the radio frequency electrical power from the conductor portion 15 so as to maximize the efficiency of the supply of the radio frequency electrical power into the conductor portion 15. Moreover, another radio frequency power source 24 is connected to the conductor portion 15 via a matcher 25. The other radio frequency power source 24 supplies radio frequency electrical power of a lower frequency than the radio frequency electrical power supplied by the radio frequency power source 22, for example 2 MHz, to the conductor portion 15. The matcher 25 has a similar function to the matcher 23. Through the above, the susceptor 12 applies 40 MHz radio frequency electrical power and 2 MHz radio frequency electrical power into the processing space PS.

A disk-shaped electrostatic chuck 27 having an electrode plate 26 therein is provided in an upper portion of the susceptor 12. When a wafer W is mounted on the susceptor 12, the wafer W is disposed on the electrostatic chuck 27. A DC power source 28 is electrically connected to the electrode plate 26. Upon a negative DC voltage being applied to the electrode plate 26, a positive potential is produced on a rear surface of the wafer W. A potential difference thus arises between the electrode plate 26 and the rear surface of the wafer W, and hence the wafer W is attracted to and held on an upper surface of the electrostatic chuck 27 through a Coulomb force or a Johnsen-Rahbek force due to the potential difference.

An annular focus ring 29 is provided on an upper portion of the susceptor 12 so as to surround the wafer W attracted to and held on the upper surface of the susceptor 12. The focus ring 29 is made of silicon (Si) or silica ($SiO_2$). The focus ring 29 is exposed to the processing space PS, and focuses plasma in the processing space PS toward a front surface of the wafer W, thus improving the efficiency of the RIE processing. Moreover, an annular cover ring 30 made of quartz that protects a side face of the focus ring 29 is disposed surrounding the focus ring 29.

An annular coolant chamber 31 that extends, for example, in a circumferential direction of the susceptor 12 is provided inside the susceptor 12. A coolant, for example cooling water or a Galden (registered trademark) fluid, at a predetermined temperature is circulated through the coolant chamber 31 via coolant piping 32 from a chiller unit (not shown). A processing temperature of the wafer W attracted to and held on the upper surface of the susceptor 12 is controlled through the temperature of the coolant.

A plurality of heat transfer gas supply holes 33 are provided in a portion of the upper surface of the susceptor 12 on which the wafer W is attracted and held (hereinafter referred to as the "attracting surface"). The heat transfer gas supply holes 33 are connected to a heat transfer gas supply unit (not shown) by a heat transfer gas supply line 34 which is disposed inside the susceptor 12. The heat transfer gas supply unit supplies helium (He) gas as a heat transfer gas via the heat transfer gas supply holes 33 into a gap between the attracting surface of the susceptor 12 and the rear surface of the wafer W.

A plurality of pusher pins 35 are provided in the attracting surface of the susceptor 12 as lifting pins that can be made to project out from the upper surface of the susceptor 12. The pusher pins 35 are connected to a motor (not shown) by a ball screw (not shown), and can be made to project out from the attracting surface of the susceptor 12 through rotational motion of the motor, which is converted into linear motion by the ball screw. The pusher pins 35 are housed inside the susceptor 12 when a wafer W is being attracted to and held on the attracting surface of the susceptor 12 so that the wafer W can be subjected to the RIE processing, and are made to project out from the upper surface of the susceptor 12 so as to lift the wafer W up away from the susceptor 12 when the wafer W is to be transferred out from the substrate processing chamber 11 after having been subjected to the RIE processing.

A gas introducing shower head 36 is disposed in a ceiling portion of the substrate processing chamber 11 such as to face the susceptor 12. The gas introducing shower head 36 has an electrode plate support 38 made of an insulating material having a buffer chamber 37 formed therein, and an upper electrode plate 39 supported from the electrode plate support 38. A lower surface of the upper electrode plate 39 is exposed to the processing space PS. The upper electrode plate 39 is a disk-shaped member made of a conductive material, for example silicon. A peripheral portion of the upper electrode plate 39 is covered by an annular shield ring 40 made of an insulating material. The upper electrode plate 39 is thus electrically insulated by the electrode plate support 38 and the shield ring 40 from the wall of the substrate processing chamber 11, which is at the ground potential.

A DC power source 41 is electrically connected to the upper electrode plate 39, and applies a negative DC voltage to the upper electrode plate 39. The upper electrode plate 39 thus applies a DC voltage into the processing space PS. Because a DC voltage is applied to the upper electrode plate 39, there is no need to provide a matcher between the upper electrode plate 39 and the DC power source 41, and hence compared with the case that a radio frequency power source is connected to the upper electrode plate via a matcher as in a conventional plasma processing apparatus, the structure of the plasma processing apparatus 10 can be simplified.

A processing gas introducing pipe 42 leading from a processing gas supply unit (not shown) is connected to the buffer chamber 37 in the electrode plate support 38. Moreover, the gas introducing shower head 36 has therein a plurality of gas holes 43 that communicate the buffer chamber 37 to the processing space PS. A processing gas supplied from the processing gas introducing pipe 42 into the buffer chamber 37 is supplied by the gas introducing shower head 36 into the processing space PS via the gas holes 43.

A transfer port 44 for the wafers W is provided in a side wall of the substrate processing chamber 11 in a position at the height of a wafer W that has been lifted up from the susceptor 12 by the pusher pins 35. A gate valve 45 for opening and closing the transfer port 44 is provided in the transfer port 44.

The plasma processing apparatus 10 further has an annular grounding ring 47 (grounding electrode) disposed such as to be exposed to the exhaust flow path 18. The grounding ring 47 is electrically grounded, and is made of a conductive material, for example silicon. The grounding ring 47 is disposed such as to surround the side face of the susceptor 12. In the plasma processing apparatus 10, electrons arising due to the DC voltage applied into the processing space PS by the upper electrode plate 39 are introduced into the grounding ring 47.

In the substrate processing chamber 11 of the plasma processing apparatus 10, the conductor portion 15 of the susceptor 12 applies radio frequency electrical power into the processing space PS, i.e. the space between the susceptor 12 and the upper electrode plate 39, as described above, whereby the processing gas supplied into the processing space PS from the gas introducing shower head 36 is turned into high-density plasma, so that positive ions and radicals are produced. Furthermore, the plasma is kept in a desired state by the upper electrode plate 39 applying a DC voltage into the processing space PS. The wafer W is subjected to the RIE processing by the positive ions and radicals.

Prior to the present invention, for a conventional plasma processing apparatus 46 as described below, the present inventors observed the state of attachment of deposit in the substrate processing chamber 11.

Figure 2:
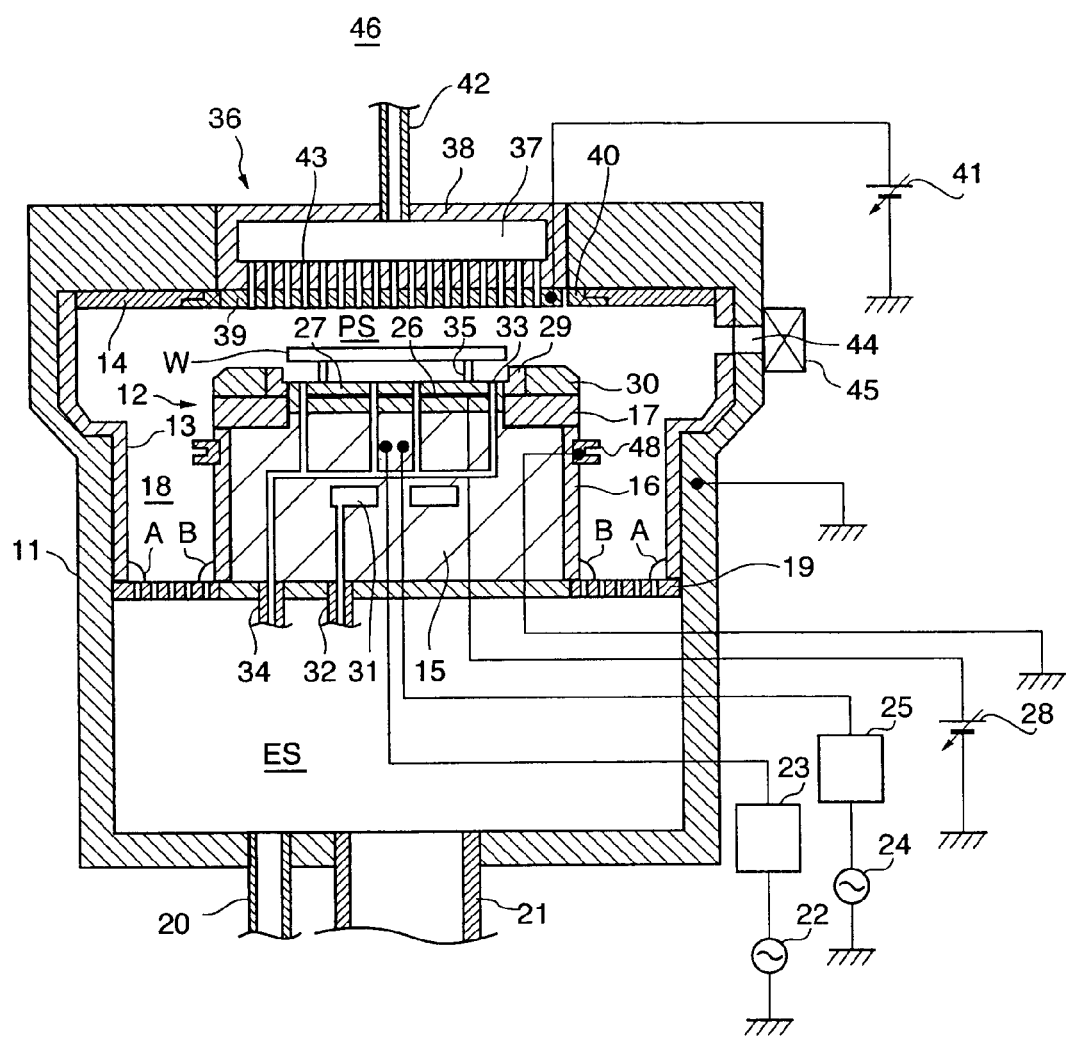
FIG. 2 is a sectional view schematically showing the construction of a conventional plasma processing apparatus.

FIG. 2 is a sectional view schematically showing the construction of the conventional plasma processing apparatus. The conventional plasma processing apparatus has basically the same construction and operation as the plasma processing apparatus 10 described above, the only difference to the plasma processing apparatus 10 being the location of the grounding ring. Features of the construction and operation that are the same as for the plasma processing apparatus 10 will thus not be described, only features of the construction and operation that are different to for the plasma processing apparatus 10 being described below.

As shown in FIG. 2, the plasma processing apparatus 46 has a grounding ring 48 disposed in the vicinity of the enclosure member 17 in the exhaust flow path 18. The construction and function of the grounding ring 48 are as for the grounding ring 47 in the plasma processing apparatus 10.

Using the plasma processing apparatus 46, the present inventors set the pressure in the processing space PS to 6.67 Pa (50 mTorr), supplied in 40 MHz radio frequency electrical power at 2100 W from the radio frequency power source 22, supplied in 2 MHz radio frequency electrical power at 500 W from the other radio frequency power source 24, and without applying a DC voltage to the upper electrode plate 39 from the DC power source 41, supplied $C_4F_8$ gas and Ar gas into the processing space PS with the flow rates thereof set to 10 sccm and 1000 sccm respectively, thus producing plasma in the processing space PS. The present inventors then measured the deposit attachment rate (depo rate) for the surface of each of the side wall member 13, the susceptor side face covering member 16, the enclosure member 17, and the exhaust plate 19 for the case of continuing the RIE processing for 5 minutes.

Figure 3A:
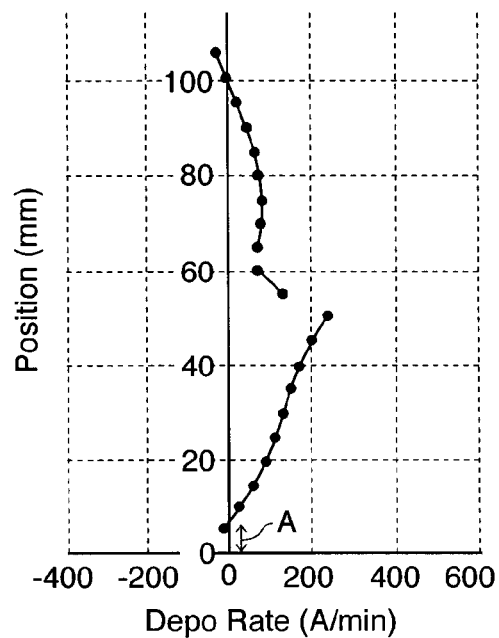
FIGS. 3A to 3C are graphs showing depo rates for component elements of the conventional plasma processing apparatus, FIG. 3A showing the depo rate for a side wall member, FIG. 3B showing the depo rate for an exhaust plate, and FIG. 3C showing the depo rate for a susceptor side face covering member and an enclosure member.
Figure 3B:
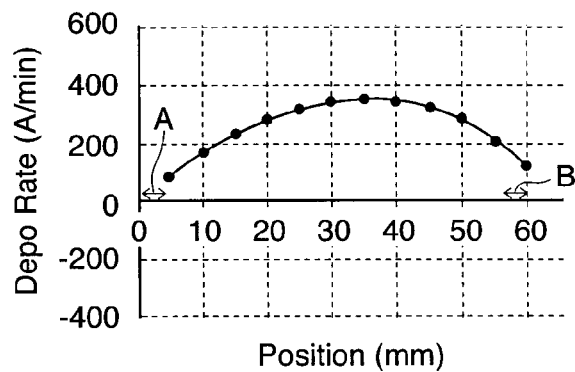
Figure 3C:
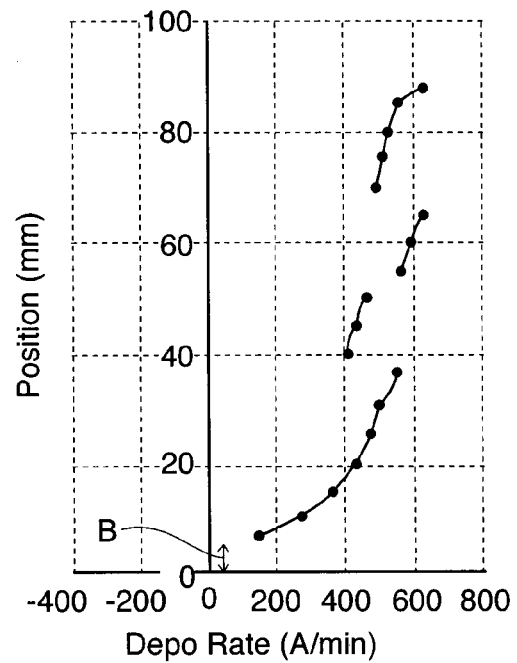

FIGS. 3A to 3C are graphs showing the depo rates for the various component elements of the conventional plasma processing apparatus, FIG. 3A showing the depo rate for the side wall member, FIG. 3B showing the depo rate for the exhaust plate, and FIG. 3C showing the depo rate for the susceptor side face covering member and the enclosure member. In FIGS. 3A and 3C, the vertical axis shows the position from the exhaust plate 19, and in FIG. 3B, the horizontal axis shows the position from the point of intersection between the side wall member 13 and the exhaust plate 19. Moreover, the 60 mm point on the horizontal axis of the graph of FIG. 3B corresponds to the point of intersection between the exhaust plate 19 and the susceptor side face covering member 16. Furthermore, arrows A and B in FIGS. 3A to 3C correspond respectively to portions A and B in FIG. 2.

As shown by the graphs of FIGS. 3A to 3C, at each of arrows A and B, the depo rate is low, and hence it was found that a deposit film is hardly formed on any of the surfaces at the portions A and B (corner portions) in FIG. 2, specifically in a cross section of the substrate processing chamber 11, within a circle of radius 5 mm centered on the position where the surface of the side wall member 13 and the surface of the exhaust plate 19 intersect, and within a circle of radius 5 mm centered on the position where the surface of the susceptor side face covering member 16 and the surface of the exhaust plate 19 intersect.

To investigate the reason why a deposit film is hardly formed at each of the corner portions, the present inventors thus then first investigated the cause of attachment of deposit to the surfaces of the side wall member 13 and so on. It is thought that, as the cause of attachment of deposit, in general there are a case that CF type radicals collide with and become attached to the surfaces, and a case that low-energy CF type ions reach and become attached as is to the surfaces.

First, to investigate the extent of collisions between radicals and the surfaces, for the plasma processing apparatus 46, the present inventors supplied in 40 MHz radio frequency electrical power at 500 W from the radio frequency power source 22, and without supplying in 2 MHz radio frequency electrical power from the other radio frequency power source 24, supplied a processing gas containing $O_2$ into the processing space PS, so as to produce oxygen radicals in the processing space PS. The present inventors then measured the etch rate for the surface of the exhaust plate 19 for the case of carrying out ashing processing using the oxygen radicals. The etch rate in the ashing processing depends on the number of colliding radicals incident.

Figure 4:
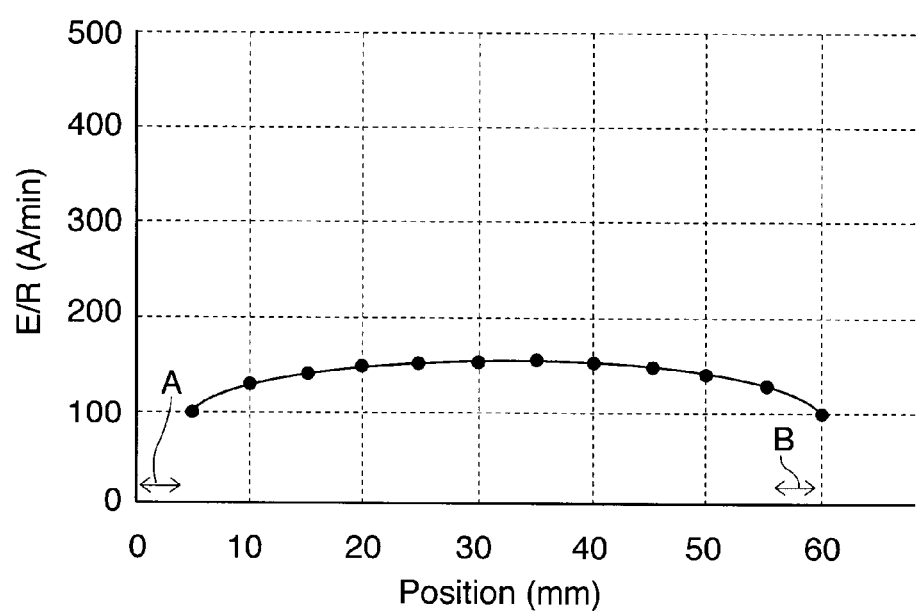
FIG. 4 is a graph showing an etch rate for the exhaust plate during ashing processing.

FIG. 4 is a graph showing the etch rate for the exhaust plate during the ashing processing. In FIG. 4, the vertical axis shows the etch rate (E/R), and the horizontal axis shows the position from the point of intersection between the side wall member 13 and the exhaust plate 19. Moreover, the 60 mm point on the horizontal axis of the graph of FIG. 4 corresponds to the point of intersection between the exhaust plate 19 and the susceptor side face covering member 16. Furthermore, arrows A and B in FIG. 4 correspond respectively to the portions A and B in FIG. 2.

As shown by the graph of FIG. 4, the etch rate hardly changes between in the vicinity of arrow A, in the vicinity of arrow B, and between arrows A and B. That is, it was found that the number of radicals incident hardly changes over the whole of the surface of the exhaust plate 19. On the other hand, as described above, a deposit film is hardly formed on portions of the surface of the exhaust plate 19 corresponding to the portions A and B. It was thus found that, for the surface of the exhaust plate 19, the distribution of the amount of deposit attached does not match the distribution of the number of radicals incident. It was thus found that the cause of attachment of deposit to the surfaces of the side wall member 13 and so on is low-energy CF type ions reaching and becoming attached as is to the surfaces.

It is difficult to clearly explain the mechanism by which a deposit film is hardly formed at the corner portions, but as a result of investigating the cause of attachment of deposit as described above, the present inventors arrived at the following hypothesis.

That is, electrons arising when plasma is produced in the processing space PS diffuse through the substrate processing chamber 11 by free motion, but at a corner portion formed through intersection of surfaces of component elements (e.g. the side wall member 13 and the exhaust plate 19) of the substrate processing chamber 11, the frontage to the processing space PS is low, and hence electrons do not readily enter therein, whereby the electron density is reduced at the corner portion. At such a place where the electron density is low, the Coulomb field of CF type ions acting on the electrons is shielded (through Debye shielding), and hence the electrons and CF type ions do not attract one another and thus the electrons and CF type ions do not coexist. Accordingly, at a corner portion, plasma does not readily exist, and hence the number of CF type ions is reduced. As a result, there are hardly any low-energy CF type ions that reach the surface of the side wall member 13 or the like, and hence a deposit film is hardly formed at such a corner portion.

Figure 5:
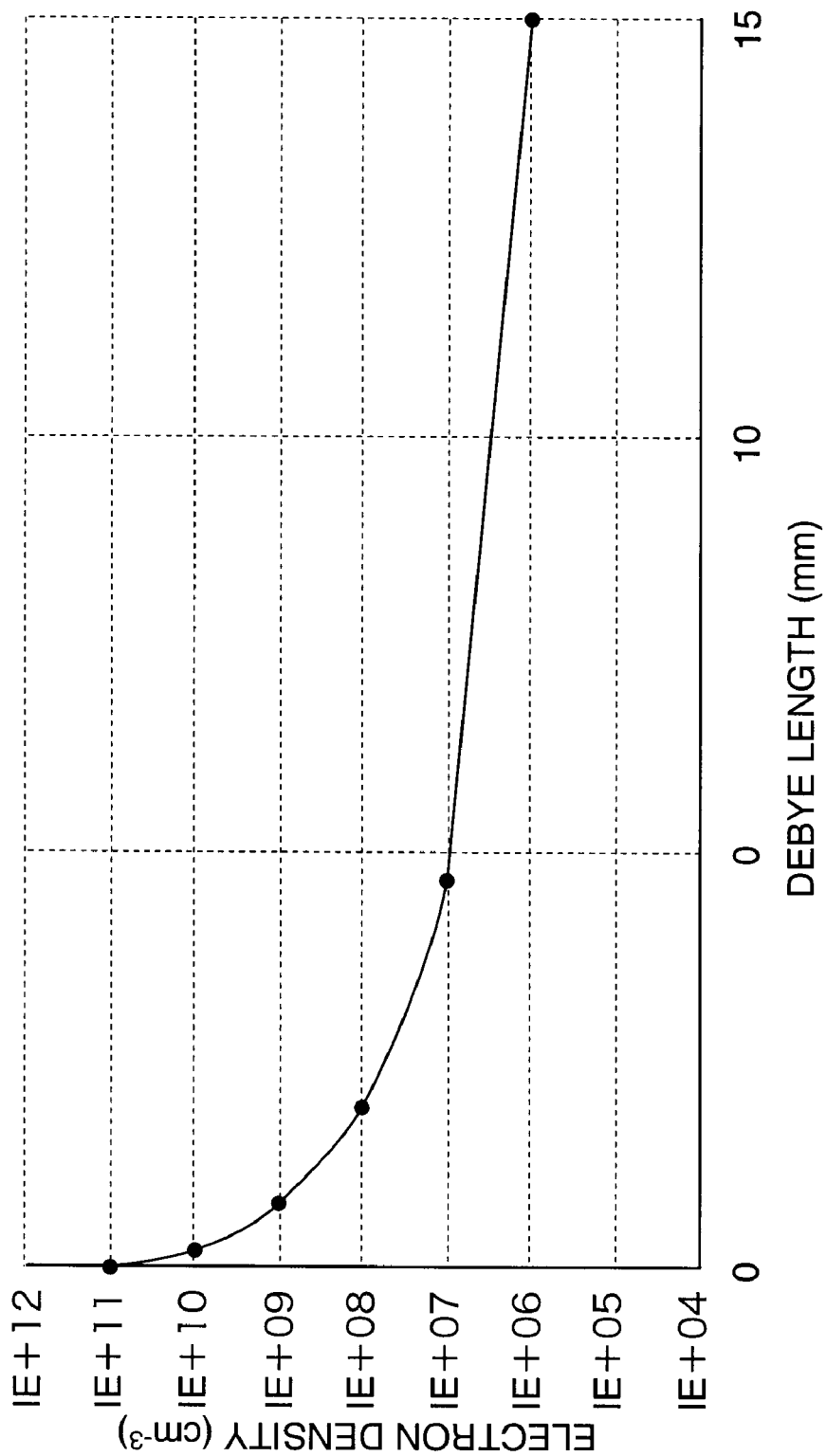
FIG. 5 is a graph showing the relationship between Debye length and electron density.
Figure 6A:
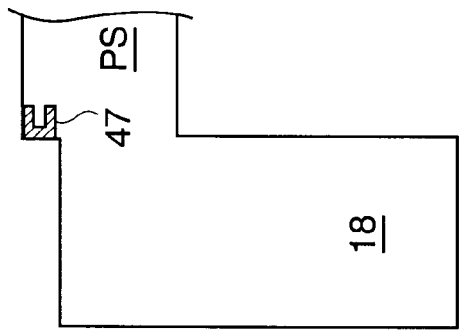
FIGS. 6A to 6D are views showing variations of a location of a grounding ring.
Figure 6B:
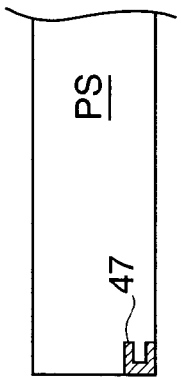
Figure 6C:
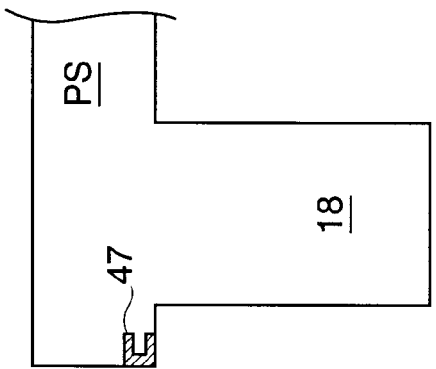
Figure 6D:
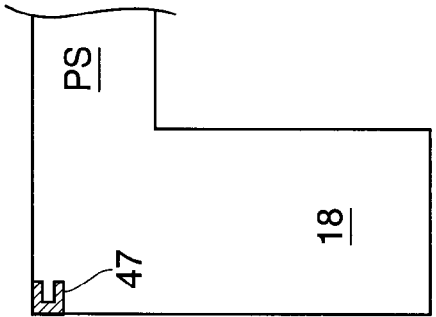

In the case that the Coulomb field of an ion is shielded, the minimum distance between the ion and an electron on which the Coulomb field of the ion does not act is called the Debye length. As shown by the graph of FIG. 5, the Debye length increases as the electron density decreases. Here, in the plasma processing apparatus 46, it is thought that the Coulomb field of the CF type ions is shielded within a circle of radius 5 mm centered on the position where the surface of the side wall member 13 and the surface of the exhaust plate 19 intersect, and within a circle of radius 5 mm centered on the position where the surface of the susceptor side face covering member 16 and the surface of the exhaust plate 19 intersect. It can thus be seen that the Debye length in each of the portions A and B is 5 mm, and furthermore, based on the graph of FIG. 5, that the electron density in each of the portions A and B, at least the electron density at the position where the surface of the susceptor side face covering member 16 and the surface of the exhaust plate 19 intersect, is not more than $10^7$ cm$^{-3}$.

Moreover, it was conjectured that electrons diffusing through the substrate processing chamber 11 will not readily enter any corner portion formed through intersection of surfaces of component elements of the substrate processing chamber 11, and hence that a deposit film will hardly be formed in any such corner portion.

In the present embodiment, based on the above findings, the grounding ring 47 is disposed in the corner portion formed through intersection of the surface of the susceptor side face covering member 16 and the surface of the exhaust plate 19, specifically such that, in a cross section of the substrate processing chamber 11, a cross-sectional shape of a portion of the grounding ring 47 exposed to the exhaust flow path 18 is contained within a circle of radius 5 mm centered on the position where the surface of the susceptor side face covering member 16 and the surface of the exhaust plate 19 intersect.

According to the plasma processing apparatus 10, the grounding ring 47 is disposed in the corner portion formed through intersection of the surface of the susceptor side face covering member 16 and the surface of the exhaust plate 19, specifically such that, in a cross section of the substrate processing chamber 11, the cross-sectional shape of the portion of the grounding ring 47 exposed to the exhaust flow path 18 is contained within a circle of radius 5 mm centered on the position where the surface of the susceptor side face covering member 16 and the surface of the exhaust plate 19 intersect. A deposit film is formed by CF type ions, but because electrons of the plasma produced in the processing space PS do not readily enter the above corner portion, the number of CF type ions is reduced in the corner portion. CF type ions thus do not reach the grounding ring 47, and hence a deposit film can be prevented from being formed on the surface of the grounding ring 47.

Moreover, in the plasma processing apparatus 10, the grounding ring 47 is disposed in a place having an electron density of not more than $10^7$ cm$^{-3}$, specifically such that, in a cross section of the substrate processing chamber 11, the cross-sectional shape of the portion of the grounding ring 47 exposed to the exhaust flow path 18 is contained within a circle of radius 5 mm centered on a position where the electron density is not more than $10^7$ cm$^{-3}$. In such a place where the electron density is low, the Coulomb field of CF type ions acting on electrons is shielded. That is, the electrons and CF type ions do not attract one another, and thus the electrons and CF type ions do not coexist, and hence plasma does not readily exist. CF type ions that would form a deposit film thus do not reach the grounding ring 47, and hence a deposit film can be prevented from being formed on the surface of the grounding ring 47.

In the plasma processing apparatus 10 described above, the grounding ring 47 is disposed in the corner portion formed through intersection between the surface of the susceptor side face covering member 16 and the surface of the exhaust plate 19. However, the corner portion in which the grounding ring 47 is disposed is not limited thereto, but rather may be any corner portion formed through intersection of surfaces of component elements of the substrate processing chamber 11 (see, for example, FIGS. 6A to 6D). Electrons diffusing through the substrate processing chamber 11 do not readily enter any of the corner portions, and hence a deposit film can be prevented from being formed on the surface of the grounding ring 47 in any of the corner portions.

Figure 7A:
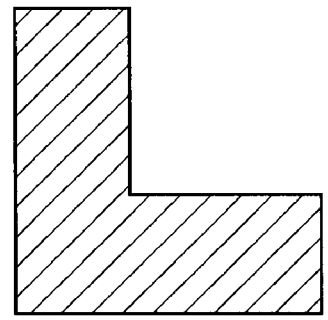
FIGS. 7A to 7C are views showing variations of a cross-sectional shape of the grounding ring.
Figure 7B:
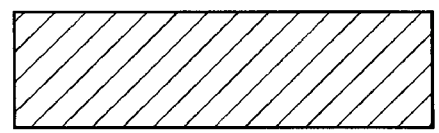
Figure 7C:
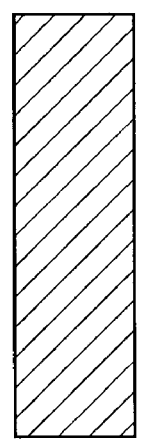

Moreover, instead of being disposed in a corner portion as described above, the grounding ring 47 may be housed in a recess of the substrate processing chamber 11 that is recessed with respect to the processing space PS. Such a recess also has low frontage to the processing space PS, and thus electrons will not readily enter therein, and hence a deposit film can be prevented from being formed on the surface of the grounding ring 47 housed therein. The cross-sectional shape of the grounding ring 47 is also not limited to being U-shaped as shown in FIG. 2, but rather may instead be L-shaped, rectangular being horizontally long, or rectangular being vertically long (see FIGS. 7A to 7C).

Figure 8:
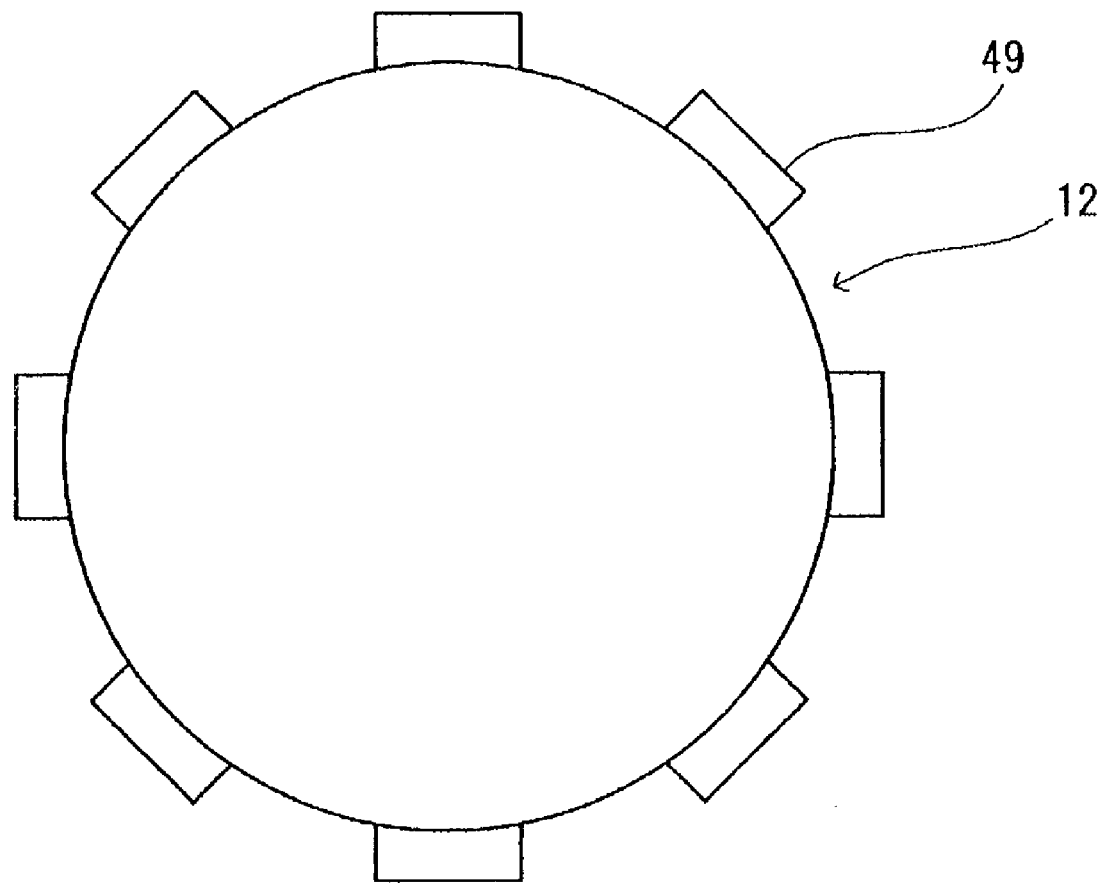
FIG. 8 is a sectional view of FIG. 1 along line VIII-VIII.

In the plasma processing apparatus 10, an annular 47 is used as the grounding electrode. However, the grounding electrode need not be annular, but rather the grounding electrode may, for example, as shown in FIG. 8, be comprised of a plurality of divided conductive bodies 49, the conductive bodies 49 being disposed dispersed over the side face of the susceptor 12 or the like.

Moreover, the plasma processing apparatus to which the present invention is applied may be any apparatus in which plasma is produced in a processing space. Specifically, the plasma processing apparatus may be not only one in which radio frequency electrical power of two different frequencies is supplied to the susceptor 12 as a radio frequency electrode as in the plasma processing apparatus 10 described above, but also one in which radio frequency electrical power is supplied to both the upper electrode plate and the susceptor, or one in which only one type of radio frequency electrical power is supplied to the susceptor.

Furthermore, the substrates subjected to the RIE processing in the plasma processing apparatus 10 are not limited to being semiconductor wafers for semiconductor devices, but rather may instead be any of various substrates used in LCDs (Liquid Crystal Displays), FPDs (Flat Panel Displays) or the like, photomasks, CD substrates, printed substrates, or the like.

WORKING EXAMPLES

Next, working examples of the present invention will be described in detail.

Working Example 1

Using the plasma processing apparatus 10 described above, the pressure in the processing space PS was set to 6.67 Pa (50 mTorr), 40 MHz radio frequency electrical power was supplied in at 1000 W from the radio frequency power source 22, 2 MHz radio frequency electrical power was not supplied in from the other radio frequency power source 24, a DC voltage of −600V was applied to the upper electrode plate 39 from the DC power source 41, and $C_4F_8$ gas, Ar gas, and $N_2$ gas were supplied into the processing space PS with the flow rates thereof set to 6 sccm, 1000 sccm, and 120 sccm respectively, thus producing plasma in the processing space PS. Formation of a deposit film on the surface of the grounding ring 47 was then observed for the case of continuing the RIE processing for 5 minutes.

Comparative Example 1

In the plasma processing apparatus 46 described above, the RIE processing conditions were set as in working example 1, and formation of a deposit film on the surface of the grounding ring 48 was observed for the case of continuing the RIE processing for 5 minutes.

In working example 1, a deposit film was hardly formed on the surface of the grounding ring 47, whereas in comparative example 1, a deposit film was formed over the whole surface of the grounding ring 48. It was thus found that if the grounding ring 47 is disposed in a corner portion formed through intersection of surfaces of component elements of the substrate processing chamber 11, then a deposit film can be prevented from being formed on the surface of the grounding ring 47.

Next, the relationship between the value of each type of radio frequency electrical power supplied to the susceptor 12, the value of the DC voltage applied to the upper electrode plate 39, and formation of a deposit film on the surface of the grounding ring 47 was studied.

Working Example 2

First, in the plasma processing apparatus 10, the RIE processing conditions were set as in working example 1 except that 2 MHz radio frequency electrical power was supplied in at 1000 W from the other radio frequency power source 24, and then the formation of a deposit film on the surface of the grounding ring 47 was observed for the case of continuing the RIE processing for 5 minutes.

Working Example 3

First, in the plasma processing apparatus 10, the RIE processing conditions were set as in working example 1 except that the 40 MHz radio frequency electrical power was supplied in at 2000 W from the radio frequency power source 22, and then the formation of a deposit film on the surface of the grounding ring 47 was observed for the case of continuing the RIE processing for 5 minutes.

Working Example 4

First, in the plasma processing apparatus 10, the RIE processing conditions were set as in working example 1 except that a DC voltage of −1200V was applied to the upper electrode plate 39 from the DC power source 41, and then the formation of a deposit film on the surface of the grounding ring 47 was observed for the case of continuing the RIE processing for 5 minutes.

For each of above working examples 1 to 4, a deposit film was hardly formed on the surface of the grounding ring 47. It was thus found that if the grounding ring 47 is disposed in a corner portion formed through intersection of surfaces of component elements of the substrate processing chamber 11, then regardless of the value of the DC voltage and the value of each type of radio frequency electrical power, a deposit film can be prevented from being formed on the surface of the grounding ring 47.

Moreover, in each of above working examples 1 to 4, it was verified that a DC current of a predetermined value flowed into the grounding ring 47. It was thus found that even if the grounding ring 47 is disposed in a position where the electron density is not more than $10^7$ cm$^{-3}$ so as to prevent formation of a deposit film, the grounding ring 47 still acts as a counter electrode for the upper electrode plate 39, whereby a DC voltage can be applied into the processing space PS.

The above-described embodiments are merely exemplary of the present invention, and are not to be construed to limit the scope of the present invention.

The scope of the present invention is defined by the scope of the appended claims, and is not limited to only the specific descriptions in this specification. Furthermore, all modifications and changes belonging to equivalents of the claims are considered to fall within the scope of the present invention.

What is claimed is:

1. A plasma processing apparatus comprising:
  a substrate processing chamber having therein a processing space in which plasma processing is carried out on a substrate;
  an RF electrode that applies radio frequency electrical power into said processing space;
  a DC electrode that applies a DC voltage into said processing space;
  a grounding electrode, at least part of which is exposed in said substrate processing chamber;
  a mounting stage on a top of which the substrate is mounted; and
  an exhaust plate disposed in an exhaust flow path formed between an inner wall of said substrate processing chamber and a side face of the mounting stage,
  wherein said grounding electrode is disposed in a corner portion formed through an intersection of the side face of said mounting stage and said exhaust plate so as to be contained within a space defined by distances of within 5 mm from a position where the side face of said mounting stage and said exhaust plate intersect,
  wherein said grounding electrode is comprised of a conductive body exposed directly to said processing space,
  wherein said grounding electrode is comprised of a member other than said exhaust plate, a wall portion of said substrate processing chamber and said mounting stage, and wherein the exhaust plate is fixed within the plasma processing apparatus.

2. A plasma processing apparatus as claimed in claim 1, wherein said grounding electrode is comprised of a plurality of divided conductive bodies dispersed over the side face of said mounting stage.

* * * * *